US012592682B1

(12) United States Patent
Adhikary et al.

(10) Patent No.: US 12,592,682 B1
(45) Date of Patent: Mar. 31, 2026

(54) VOLTAGE SCALABLE LEVEL SHIFTER

(71) Applicant: Synopsys, Inc., Mountain View, CA (US)

(72) Inventors: Sayan Adhikary, West Bengal (IN); Ankit Agrawal, Uttar Pradesh (IN)

(73) Assignee: SYNOPSYS, INC., Sunnyvale, CA (US)

( * ) Notice: Subject to any disclaimer, the term of this patent is extended or adjusted under 35 U.S.C. 154(b) by 47 days.

(21) Appl. No.: 18/047,237

(22) Filed: Oct. 17, 2022

(51) Int. Cl.
*H03K 3/011* (2006.01)
*G06F 30/367* (2020.01)
*H03K 3/356* (2006.01)

(52) U.S. Cl.
CPC ........... *H03K 3/011* (2013.01); *G06F 30/367* (2020.01); *H03K 3/35613* (2013.01)

(58) Field of Classification Search
CPC ... H03K 3/011; H03K 3/35613; G06F 30/367
See application file for complete search history.

(56) References Cited

U.S. PATENT DOCUMENTS

| | | | | |
|---|---|---|---|---|
| 9,755,621 | B1 * | 9/2017 | Sinha | H03K 3/356113 |
| 10,284,201 | B1 * | 5/2019 | Rana | H03K 19/01707 |
| 11,727,175 | B2 * | 8/2023 | Fischer | G06F 30/3308 |
| | | | | 716/106 |

* cited by examiner

*Primary Examiner* — Menatoallah Youssef
*Assistant Examiner* — Colleen J O'Toole
(74) *Attorney, Agent, or Firm* — WOMBLE BOND DICKINSON (US) LLP

(57) ABSTRACT

A circuit. In some embodiments, the circuit includes: a first pair of transistors, configured as a cross-coupled pair of transistors; a second pair of transistors, configured as another cross-coupled pair of transistors; and a first series combination of one or more voltage clamping transistors. A first transistor of the first pair of transistors may have a current-carrying terminal electrically coupled to a first end terminal of the first series combination of one or more voltage clamping transistors, and a first transistor of the second pair of transistors may have a first current-carrying terminal electrically coupled to a second end terminal of the first series combination of one or more voltage clamping transistors.

18 Claims, 5 Drawing Sheets

VOLTAGE SCALABLE LEVEL SHIFTER

TECHNICAL FIELD

The present disclosure generally relates to an integrated circuit (IC). In particular, the present disclosure relates to a system and method for providing a voltage scalable level shifting circuit.

BACKGROUND

Digital integrated circuits may include internal logic operating between internal voltage levels selected to meet performance and power consumption requirements and to avoid exposing transistors to voltages sufficiently great to damage them. External circuitry, to which an integrated circuit may, in operation, be connected, may operate at other voltages, e.g., voltages that are greater than the internal voltage levels of the integrated circuit.

SUMMARY

According to an embodiment of the present disclosure, there is provided a non-transitory computer readable medium including stored instructions, which when executed by a processor, cause the processor to generate a digital representation of a circuit including: a first pair of transistors, configured as a cross-coupled pair of transistors; a second pair of transistors, configured as another cross-coupled pair of transistors; and a first series combination of one or more voltage clamping transistors, a first transistor of the first pair of transistors having a current-carrying terminal electrically coupled to a first end terminal of the first series combination of one or more voltage clamping transistors, and a first transistor of the second pair of transistors having a first current-carrying terminal electrically coupled to a second end terminal of the first series combination of one or more voltage clamping transistors.

In some embodiments, the circuit further includes a second series combination of one or more voltage clamping transistors, wherein a second current-carrying terminal of the first transistor of the second pair of transistors is connected to a first end terminal of the second series combination of one or more voltage clamping transistors, and wherein a second end terminal of the second series combination of one or more voltage clamping transistors is connected to a first reference voltage.

In some embodiments, the second series combination of one or more voltage clamping transistors includes two voltage clamping transistors.

In some embodiments, the circuit further includes an input amplifier including a voltage clamping transistor of the second series combination of one or more voltage clamping transistors.

In some embodiments, the input amplifier is an inverter.

In some embodiments, the circuit further includes a gate-driving transistor having: a control terminal connected to a common node between two voltage clamping transistors of the second series combination of one or more voltage clamping transistors; a first current-carrying terminal connected to a second reference voltage; and a second current-carrying terminal connected to a control terminal of a second transistor of the second pair of transistors.

In some embodiments, the circuit further includes a capacitor, connected between a control terminal of the gate-driving transistor and a current-carrying terminal of the gate-driving transistor.

In some embodiments, the capacitor includes a field effect transistor having two current-carrying terminals connected together.

In some embodiments, each transistor of the first pair of transistors and each transistor of the second pair of transistors is a field effect transistor.

In some embodiments, the circuit includes M stress limiter stages including a first stress limiter stage, M being a positive integer, wherein the first stress limiter stage includes the second pair of transistors and a transistor of the first series combination of one or more voltage clamping transistors, and wherein a voltage drop across the circuit is M+2 times a maximum stress voltage of the first transistor of the first pair of transistors.

According to an embodiment of the present disclosure, there is provided a circuit, including: a first transistor, having a first current-carrying terminal connected to an upper reference voltage; and a second transistor, connected to a lower reference voltage, the circuit having a complementary pair of inputs and a first complementary pair of outputs, the circuit being configured to produce, in a first state, on a second current-carrying terminal of the first transistor, a first voltage, the first voltage being, relative to the lower reference voltage, greater than twice a maximum stress voltage of the first transistor.

In some embodiments, the circuit includes: a first pair of transistors, including the first transistor, the first pair of transistors being configured as a cross-coupled pair of transistors; a second pair of transistors, configured as a cross-coupled pair of transistors; and a first series combination of one or more voltage clamping transistors, a first transistor of the first pair of transistors having a current-carrying terminal connected to a first end terminal of the first series combination of one or more voltage clamping transistors, and a first transistor of the second pair of transistors having a first current-carrying terminal connected to a second end terminal of the first series combination of one or more voltage clamping transistors.

In some embodiments, the circuit further includes a second series combination of one or more voltage clamping transistors, wherein: a second current-carrying terminal of the first transistor of the second pair of transistors is connected to a first end terminal of the second series combination of one or more voltage clamping transistors, and a second end terminal of the second series combination of one or more voltage clamping transistors is connected to the lower reference voltage.

In some embodiments, the second series combination of one or more voltage clamping transistors includes two voltage clamping transistors.

In some embodiments, the circuit further includes an input amplifier including a voltage clamping transistor of the second series combination of one or more voltage clamping transistors.

In some embodiments, the input amplifier is an inverter.

In some embodiments, the circuit further includes a gate-driving transistor having: a control terminal connected to a common node between two voltage clamping transistors of the second series combination of one or more voltage clamping transistors; a first current-carrying terminal connected to an intermediate reference voltage; and a second current-carrying terminal connected to a control terminal of a second transistor of the second pair of transistors.

In some embodiments, the circuit further includes a capacitor, connected between a control terminal of the gate-driving transistor and a current-carrying terminal of the gate-driving transistor.

In some embodiments, the capacitor includes a field effect transistor having two current-carrying terminals connected together.

According to an embodiment of the present disclosure, there is provided a method, including: operating, by a level shifter, in a first state; and operating, by the level shifter, in a second state, the operating in the first state including translating, by a stress limiter stage, each of two input voltages of the stress limiter stage by a voltage increment to form two respective output voltages of the stress limiter stage each higher than the respective input voltage by the voltage increment, the voltage increment being less than or equal to a maximum stress voltage of a transistor of the level shifter, the level shifter having an input and an output, a voltage difference between the input and the output being, in each of the first state and the second state, equal to at least 1.5 times a maximum stress voltage of a transistor of the level shifter.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
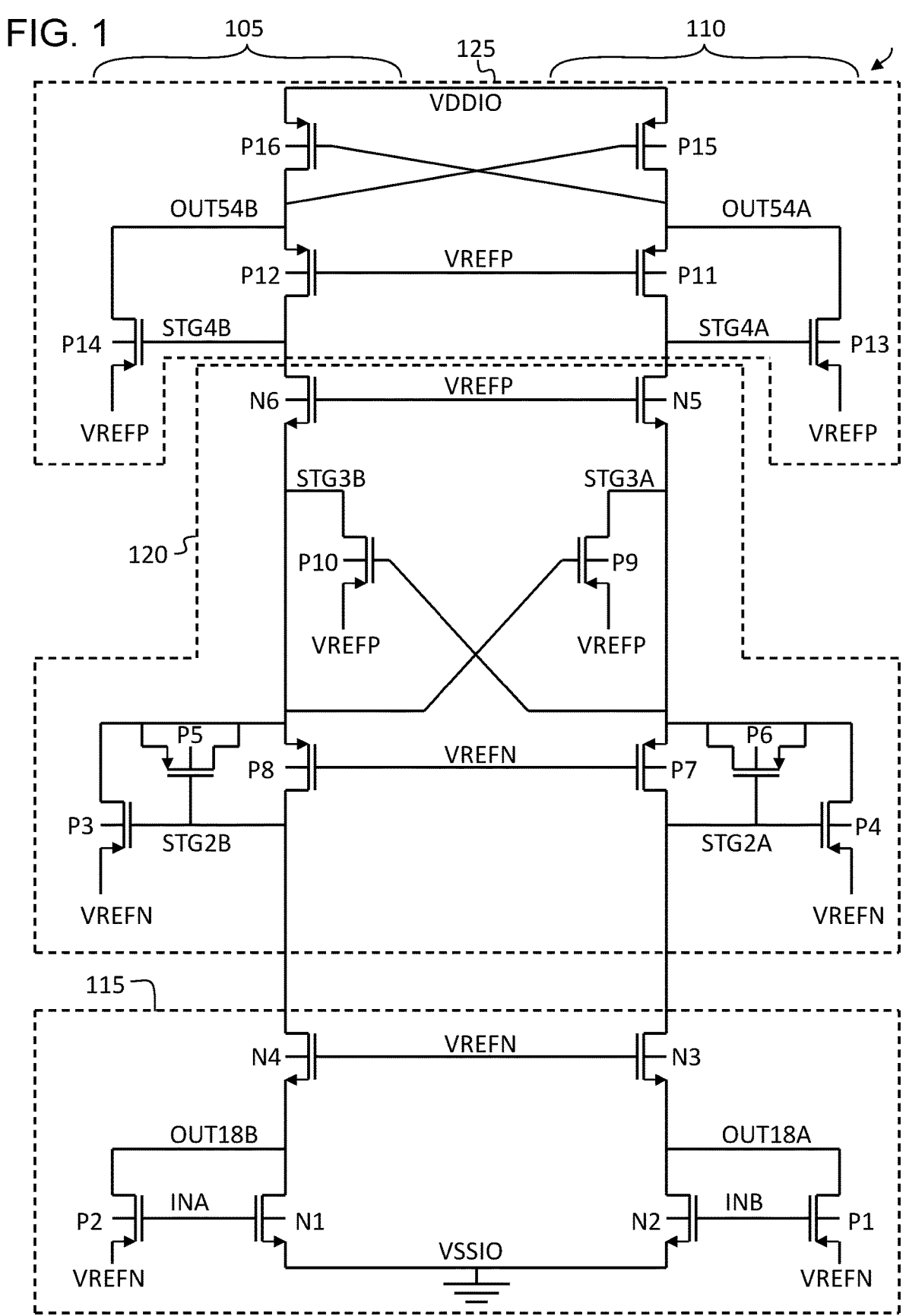
FIG. 1 illustrates a schematic diagram of the present level shifter, in accordance with some embodiments of the present disclosure.

Aspects of the present disclosure relate to a high voltage level shifter. In various applications, an integrated circuit (e.g., a digital integrated circuit) may include internal logic which level-shifts from a digital supply voltage of 1 volt (V) to the stress voltage of thick gate devices. Such an integrated circuit may be fabricated using thick gate transistors each of which is capable of tolerating a certain maximum stress voltage (which may be referred to as VSTRESS) across any two terminals (e.g. across the source and drain, across the gate and drain, or across the gate and source), which may be, e.g., 1.8 V. External circuitry, which, in operation, the integrated circuit may drive, may be configured to operate at higher voltages, e.g., at voltages that are N times VSTRESS, with N being, for example, 3, or 4, or more. Connecting a terminal (e.g., the drain) of an output transistor of the integrated circuit directly to such a higher voltage, and connecting another terminal (e.g., the gate) of the output transistor to a lower voltage, e.g., 1.8 V or ground, may, however, cause damage to the output transistor.

In some embodiments, therefore, a level shifter is constructed from transistors each having a maximum stress voltage of VSTRESS, the level shifter being connected between a positive reference voltage VDDIO and ground VSSIO and having outputs capable of operating at voltages of up to N times VSTRESS, where N is a positive integer. The level shifter may include an input circuit, an output circuit, and M stress limiter stages, connected in cascode, between the input circuit and the output circuit. As used herein, when a first circuit and a second circuit are described as being connected in "cascode" it means that an output of the first circuit is connected to an input of the second circuit, or vice versa. Each stress limiter stage may be configured to pass signals from the input circuit to the output circuit while carrying a portion of the voltage drop between the upper reference voltage and a lower reference voltage (e.g., ground). In such a circuit it may be that N=M+2, i.e., each additional stress limiter stage increases the maximum tolerable value of VDDIO by VSTRESS.

Technical advantages of the present disclosure include, but are not limited to, the ability to switch signals at voltages that are significantly greater (e.g., more than three times) as the maximum stress voltage of the transistors of which the level shifter is constructed. Moreover, the level shifter may be used to translate signals from an input voltage domain to an output voltage domain, by changing the number of stress limiter stages between a corresponding input stage and output stage. Further, the level shifter may use only N+1 reference voltages (including supply and ground), of which VDDIO and ground (VSSIO) may be supplied by external circuitry, so that the integrated circuit incorporating the level shifter may generate as few as N-1 reference voltages for use by the level shifter. Such a level shifter can be used in various interface circuit blocks (IPs), e.g., General-Purpose Input-Output circuits (GPIOs), Inter-Integrated Circuit (I2C) interface circuits, Improved Inter-Integrated Circuit (I3C) interface circuits, Secure Digital Input-Output (SDIO) interface circuits, and Serial Peripheral Interface (SPI) bus interfaces.

FIG. 1 illustrates a schematic diagram of the present level shifter, in accordance with some embodiments of the present disclosure. Referring to FIG. 1, in some embodiments, a level shifter 100 includes a left branch 105 and a right branch 110, each branch including multiple transistors. Field effect transistors (e.g., metal oxide semiconductor field effect transistors (MOSFETs)) are illustrated, but other transistors may be employed instead (e.g., bipolar junction transistors, or heterojunction bipolar transistors, or a combination of different kinds of transistors). Each transistor may have two current-carrying terminals (e.g., a source and a drain) and a control terminal (e.g., a gate). The circuit of FIG. 1 has a complementary pair of inputs, inputs INA and INB, and two complementary pairs of outputs including (i) outputs OUT18A and OUT18B, and (ii) outputs OUT54A, and OUT54B.

The level shifter 100 may operate in either of two states, a first state and a second state. In a first state, INA is low, INB is high, OUT18A and OUT54A are low, and OUT18B and OUT54B are high. In the second state, INA is high, INB is low, OUT18A and OUT54A are high, and OUT18B and OUT54B are low. The level shifter may be connected to four reference voltages, including an upper reference voltage VDDIO (e.g., 5.4 V), a first intermediate reference voltage VREFP (e.g., 3.6 V), a second intermediate reference voltage VREFN (e.g., 1.8 V) and ground, or VSSIO (e.g., 0.0 V). In the drawings, positive (p)-channel MOSFETs (p-FETs) are labeled with a "P" (e.g., "P1", "P2", etc.) and negative (n)-channel MOSFETs (n-FETs) are labeled with an "N" (e.g., "N1", "N2", etc.). VDDIO is greater than VREFP, and VREFP is greater than VREFN. In some embodiments, each of the voltage increments (VDDIO-VREFP, VREFP-VREFN, and VREFN-VSSIO) is less than or equal to the maximum stress voltage of the transistors of the level shifter.

In the first state, because INA is low, the output (OUT18B) of the inverter having transistors P2 and N1 is high (at VREFN, e.g., 1.8 V) and because INB is high the output (OUT18A) of the inverter having transistors P1 and N2 is low (at VSSIO, e.g., 0.0 V). It is appreciated that the inverter may be implemented by another circuit including, but not limited to, an amplifier, without deviating from the scope of the present disclosure. Each n-FET in FIG. 1 (and in FIGS. 2 and 3) may turn on when either the gate-source voltage (Vgs) or the gate-drain voltage (Vgd) exceeds the threshold voltage (Vt) and each p-FET in FIG. 1 (and in FIGS. 2 and 3) may turn on when either Vgs or Vgd is less than-Vt. The transistor N3 is turned on, because its gate voltage is VREFN, e.g., 1.8 V, and because its source voltage is VSSIO. N3 being turned on causes the voltage at the node STG2A to be VSSIO, which causes (i) transistor P7 to be turned off and (ii) transistor P4 to be turned on. Transistor P4 being turned on (and transistor P9 being turned off, as discussed below) causes the voltage on node STG3A to be VREFN, which causes transistor N5 to turn on, which causes the voltage on node STG4A to be VREFN, turning on transistor P13, and causing the voltage at the output OUT54A to be VREFP.

Because the output OUT54A is connected to the gate of transistor P16, this transistor is turned on, causing the voltage at the output OUT54B to be VDDIO (and causing transistor P15 to be turned off). The voltage at the output OUT54B being VDDIO causes transistor P12 to be turned on, so that the voltage on node STG4B is VDDIO, turning transistors P14 and N6 off. Transistor P10 is turned on as a result of having a source voltage of VREFP and a gate voltage of VREFN (the gate of transistor P10 being connected to the node STG3A, discussed above). This causes the voltage on the node STG3B to be VREFP, turning on transistor P8 (which has a gate at VREFN), which sets the voltage on node STG2B to be VREFP, turning off transistor P3 (by setting its gate voltage to VREFP) and turning off transistor P9 (which has current-carrying terminals at VREFN and VREFP respectively). Transistor N4 has current-carrying terminals at VREFP and VREFN respectively, and a gate at VREFN, and is turned off. The second state is complementary to the first state; each transistor that is turned on in the first state is turned off in the second state. Each transistor that is turned off in the first state is turned on in the second state. It may be seen that in each of the first state and the second state, the voltage across any pair of terminals of any transistor of the circuit does not exceed VSTRESS (e.g., 1.8 V).

The circuit of FIG. 1 includes three portions: an input circuit 115 (which is referred to as an "input circuit" for brevity, even though it generates the complementary outputs OUT18A and OUT18B), a stress limiter stage 120, and an output circuit 125 (which generates the complementary outputs OUT54A and OUT54B). Each of the output circuit 125 and the stress limiter stage 120 may include a cross-coupled pair of transistors (e.g., transistors P16 and P15 in the output circuit 125; and transistors P9 and P10 in the stress limiter stage 120), where each of the gates of the pair of transistors is connected to a current-carrying terminal of the other transistor of the same pair of transistors. Such a configuration may operate as an amplifier with positive feedback, causing the circuit to settle quickly (when there is a change in the complementary input signals) into one or the other of the first state and the second state. The input circuit 115 may include an amplifier (which may include two inverters, as illustrated).

The level shifter 100 may further include a plurality of voltage clamping transistors connected in series in each of the left branch 105 and the right branch 110. Each of these transistors may perform the function, when turned off, of carrying some of the voltage drop between VDDIO and VSSIO, so that no transistor is exposed to a voltage drop exceeding VSTRESS. For example, in the first state, in the first branch 105, each of the voltage clamping transistors N1, N4, and N6 is turned off and carries a voltage drop of VSTRESS (e.g., 1.8 V) so that the total voltage drop carried by these three transistors is VDDIO (e.g., 5.4 V). Similarly, in the second branch 110, each of the voltage clamping transistors P7, P11, and P15 is turned off and carries a voltage drop of VSTRESS (e.g., 1.8 V) so that the total voltage drop carried by these three transistors is VDDIO (e.g., 5.4 V). A transistor, such as any one of transistors P3, P4, P13, and P14, that drives the gate of a transistor of a cross-coupled pair of transistors (and that is not a voltage clamping transistor) may be referred to herein as a "gate-driving transistor". Device capacitors (each formed by connecting together the current-carrying terminals of a respective transistor of transistors P5 and P6) may be connected across transistors P3 and P4 to improve transient performance.

Figure 2:
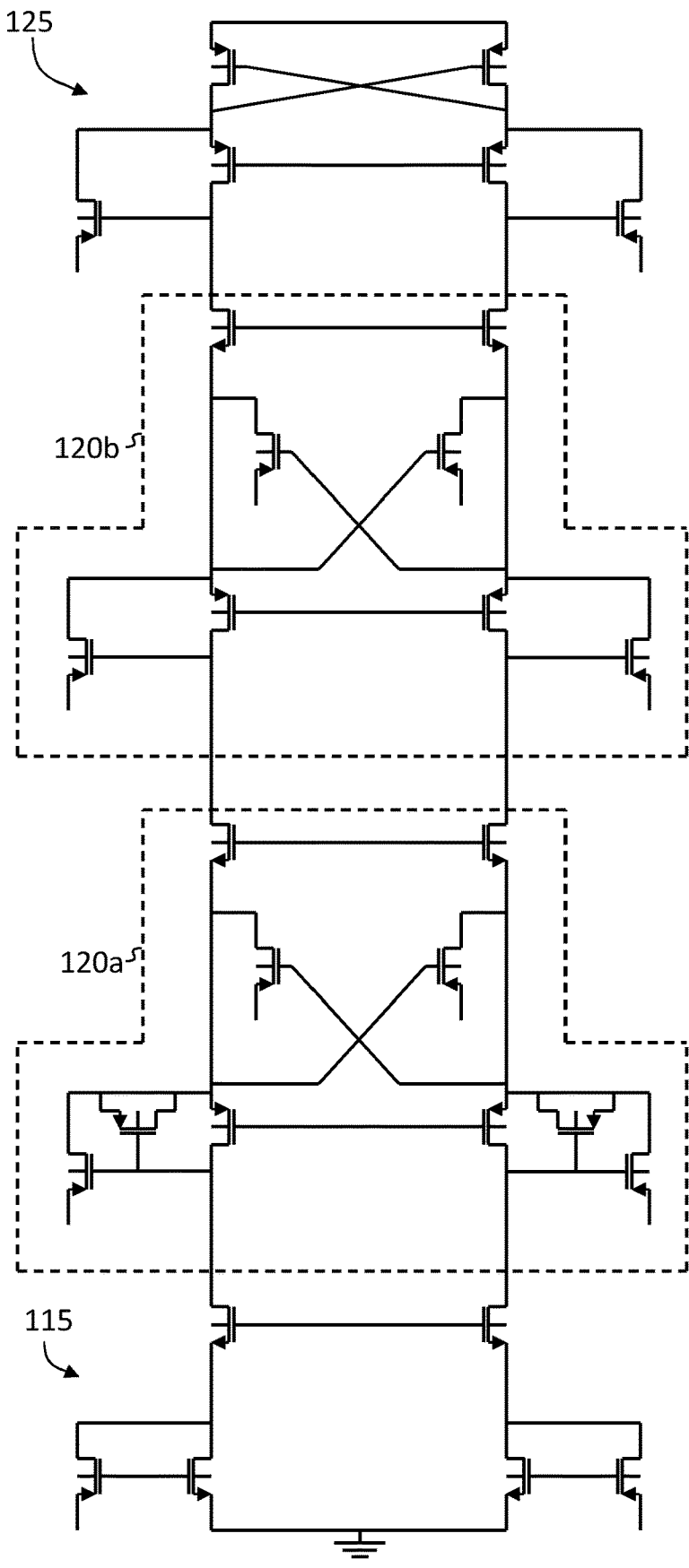
FIG. 2 illustrates another schematic diagram of the present level shifter, in accordance with some embodiments of the present disclosure.

The circuit of FIG. 1 may be modified to tolerate a greater VDDIO (for the same VSTRESS) by including in the circuit one or more additional stress limiter stages 120. FIG. 2 illustrates another schematic diagram of the present level shifter, in accordance with some embodiments of the present disclosure. The circuit of FIG. 2 includes a total of two stress limiter stages, a lower stress limiter stage 120a and an upper stress limiter stage 120b that are connected in cascode to each other. As is the case for the stress limiter stage 120 of FIG. 1, in the circuit of FIG. 2 (or in an analogous circuit with more than two stress limiter stages 120), the voltage drop across each branch of each stress limiter stage 120 is equal to VSTRESS. FIG. 1 shows a circuit with M=1, in which VDDIO is three times VSTRESS (i.e., N=3). As more stress limiter stages 120 are added to the circuit, both M and N increase by one with each additional stress limiter stage 120, so that the relationship N=M+2 is maintained (with, e.g., in FIG. 2, M being 2 and N being 4).

Figure 3:
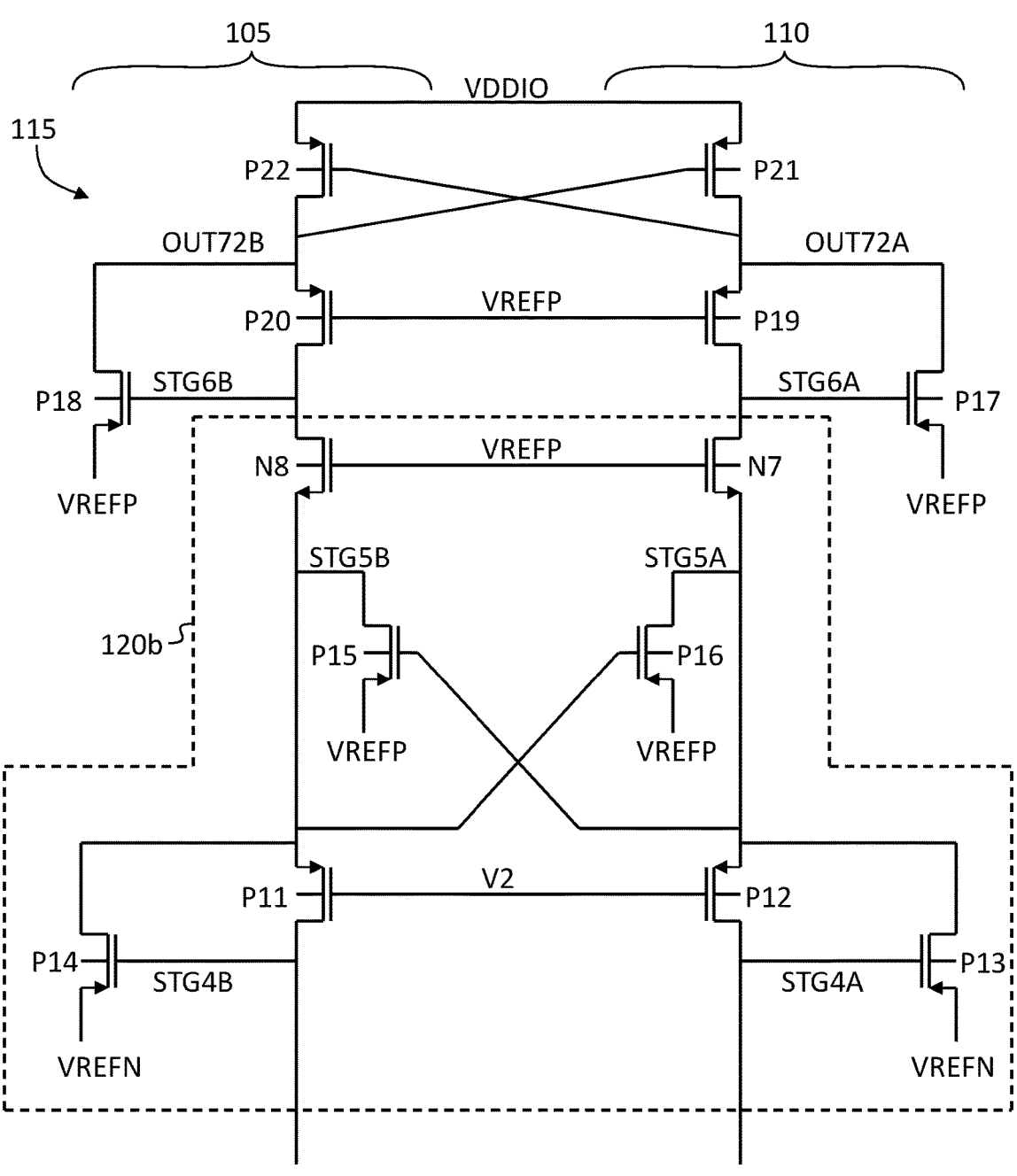
FIG. 3 illustrates a schematic diagram of a portion of the present level shifter, in accordance with some embodiments of the present disclosure.

FIG. 3 illustrates a schematic diagram of a portion of the present level shifter, in accordance with some embodiments of the present disclosure. FIG. 3 shows an enlarged view of the upper stress limiter stage 120b and the output circuit 125 of the circuit of FIG. 2. In the circuit of FIGS. 2 and 3, the reference voltage V2 may be twice of VSTRESS (e.g., 3.6 V), the voltage VREFP may be three times VSTRESS (e.g., 5.4 V) and the voltage VDDIO may be four times VSTRESS (e.g., 7.2 V). In FIG. 3, the voltages of the reference voltage nodes of the input circuit 115 and of the lower stress limiter stage 120a may be the same as the voltages of the corresponding nodes in the circuit of FIG. 1.

Each stress limiter stage 120 (in the circuits of FIGS. 1-3, or in analogous circuits with more than two stress limiter stages 120) may include a lower pair of voltage clamping transistors (e.g., transistors P7 and P8 in FIG. 1), the gates of which are connected to a reference voltage $V_i$, and an upper pair of voltage clamping transistors (e.g., transistors N5 and N6 in FIG. 1), the gates of which are connected to a reference voltage $V_{i+1}$, where $V_{i+1}$ may exceed $V_i$ by VSTRESS.

Figure 4:
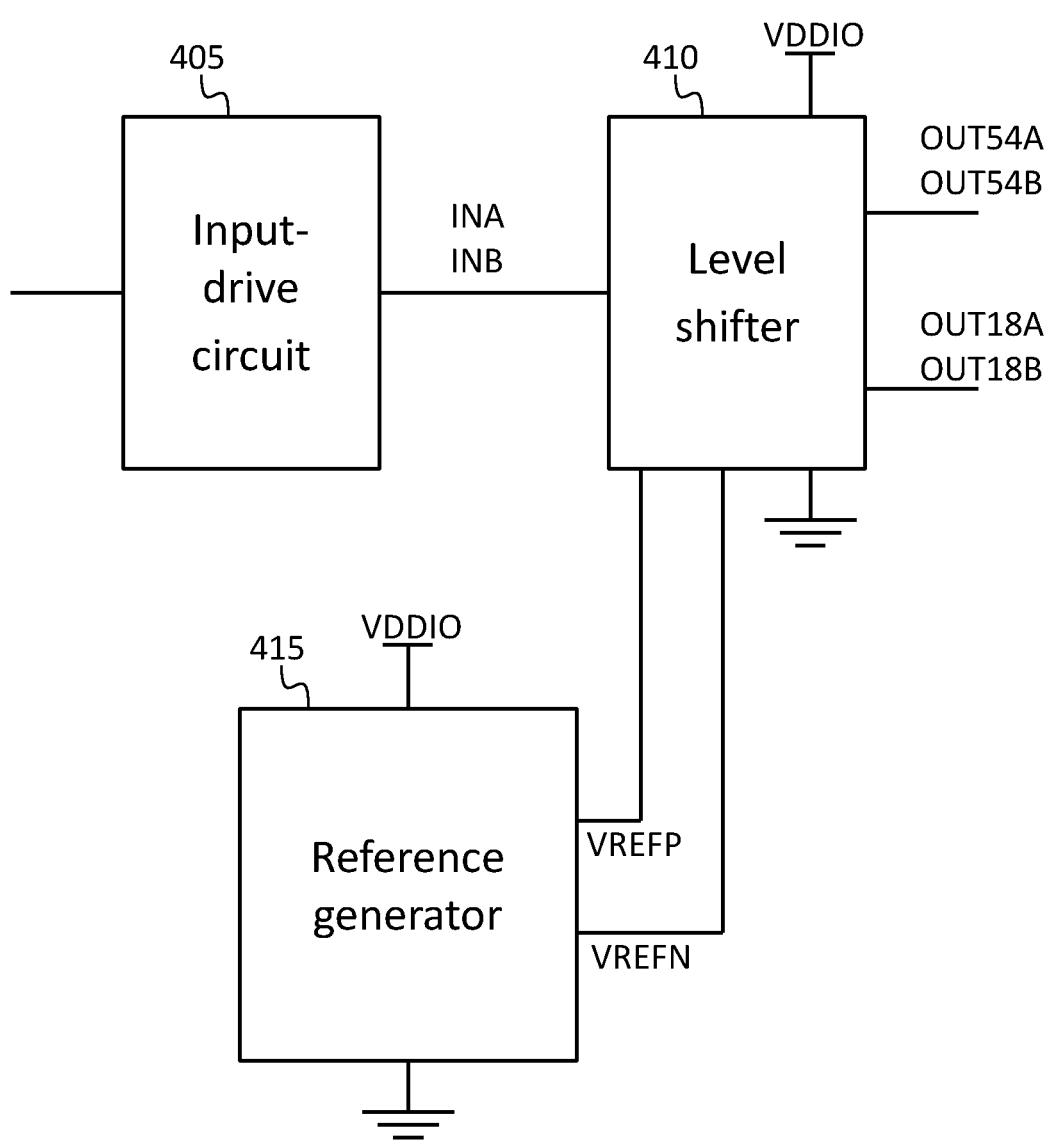
FIG. 4 illustrates a block diagram of a circuit including the present level shifter, in accordance with some embodiments of the present disclosure.

FIG. 4 illustrates a block diagram of a circuit including the present level shifter, in accordance with some embodiments of the present disclosure. An input drive circuit 405 (that may be a level shifter) may receive an input signal in the voltage range employed by digital circuitry (e.g., registers and gates) within the integrated circuit, and generate the signals INA and INB (which are complementary signals in the range between 0 V and approximately VSTRESS), and feed these signals INA and INB to the level shifter 410 (e.g., the level shifter as described in FIG. 1 or FIG. 2). A reference generator 415 may generate intermediate reference voltages (e.g., VREFN and VREFP, as illustrated, if the level shifter is constructed according to FIG. 1, or VREFN, V2, and VREFP if the level shifter is constructed according to FIG. 2).

Figure 5:
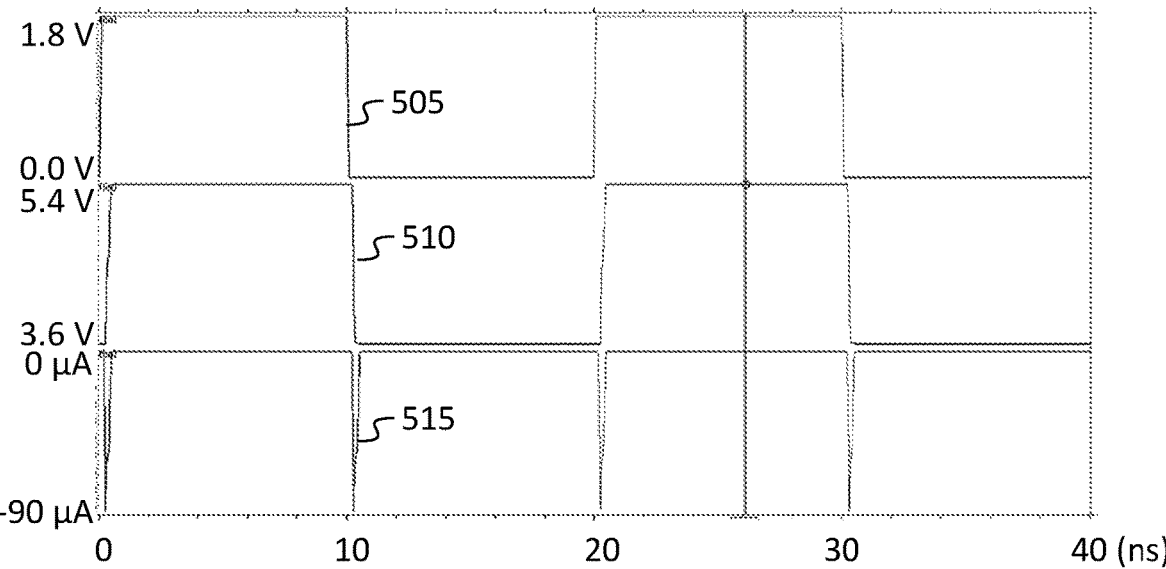
FIG. 5 illustrates a graph of simulation results, in accordance with some embodiments of the present disclosure.

FIG. 5 shows simulation results for the circuit of FIG. 1. A first trace 505 shows the voltage at the input INA and a second trace 510 shows the output voltage at the output OUT54A (with the vertical axis being voltage, in Volts, for each of the first trace 505 and the second trace 510), and a third trace 515 shows the current drawn from the VDDIO reference supply by the level shifter (with the vertical axis being in microamperes). The horizontal axis is time, in nanoseconds. The current drawn from VDDIO between transitions between the first and second states (e.g., at the cursor, which is at 26.1 ns), is 87.8 picoAmperes (pA).

Figure 6:
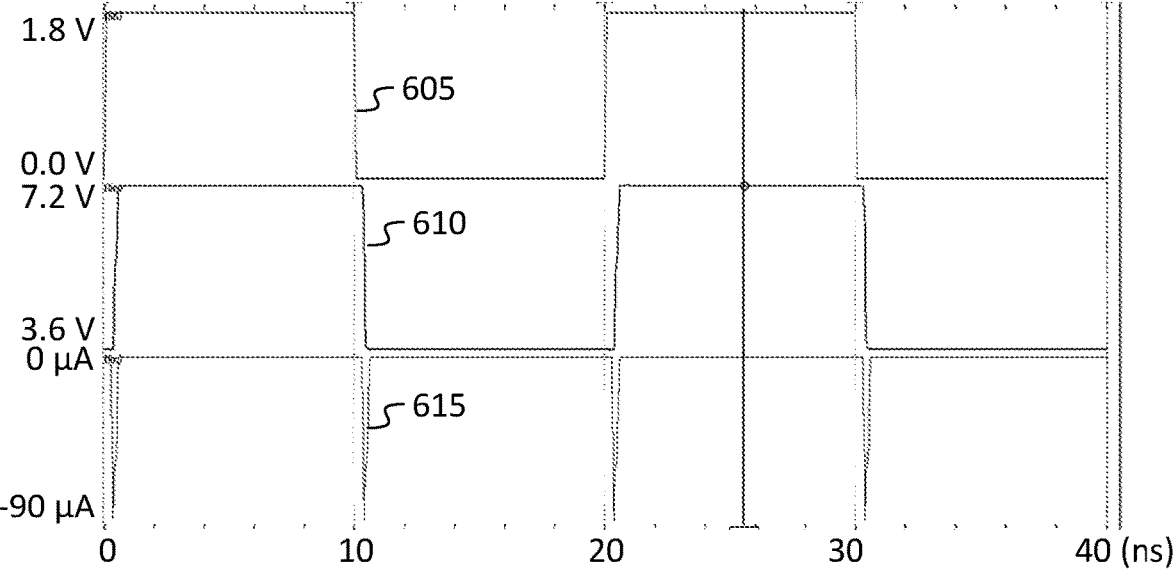
FIG. 6 illustrates another graph of simulation results, in accordance with some embodiments of the present disclosure.

FIG. 6 shows simulation results for the circuit of FIG. 2. A first trace 605 shows the voltage at the input INA and a second trace 610 shows the output voltage at the output OUT72A (with the vertical axis being voltage, in Volts, for each of the first trace 605 and the second trace 610), and a third trace 615 shows the current drawn from the VDDIO reference supply by the level shifter (with the vertical axis being in microamperes). The horizontal axis is time, in nanoseconds. The current drawn from VDDIO between transitions between the first and second states (e.g., at the cursor, which is at 25.5 ns), is 41.8 pA.

A computer-readable design of level shifter circuit according to the present disclosure may be included within a library of available pre-designed cells or circuit blocks or circuit portions stored on a computer-readable medium (e.g., in a digital representation of a level shifter). This allows the design of a level shifter circuit according to the present disclosure to be placed as a circuit block within a design of an integrated circuit (e.g., a digital representation of the integrated circuit). For example, a level shifter circuit specified by the computer-readable design may be incorporated into the design of an analog or mixed-signal integrated circuit.

As used herein, "reference voltage" may mean either a voltage produced by a reference voltage source (e.g., a reference voltage generator) or a conductor carrying such a voltage. As such, if a current-carrying terminal of a transistor is connected to a conductor connected to a reference voltage source, such that the conductor is at a first reference voltage, then the current-carrying terminal of the transistor may, for brevity, be said to be "connected to the first reference voltage".

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively change the behavior of the circuit. When a first element and a second element are connected with one or more intervening elements, the one or more intervening elements may be said to be "connected between" the first element and the second element. When two or more transistors are "connected in series" it means that the current-carrying terminals of the transistors are connected in series, such that if all of the transistors are turned on, a current may flow through them in series. As used herein, a "series combination of one or more transistors" is either (i) one transistor, or (ii) a chain of two or more transistors connected in series. Such a series combination (e.g., transistors P8, N4, and N1 in FIG. 1) may have two end terminals, i.e., (i) the current-carrying terminals of the transistor if the series combination includes a single transistor, or (ii) the two current-carrying terminals, at each end of the chain, each of which is not connected to a current-carrying terminal of another transistor in the chain. When a connection is made to a series combination of one or more transistors, it means, unless otherwise specified, that a connection is made to one of the end terminals of the series combination.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:
   a first pair of transistors, configured as a cross-coupled pair of transistors;
   a second pair of transistors, configured as another cross-coupled pair of transistors;
   a first series combination of one or more voltage clamping transistors;
   a gate-driving transistor having a first current-carrying terminal connected to a first reference voltage and a second current-carrying terminal connected to a control terminal of a second transistor of the second pair of transistors; and
   a capacitor connected between a control terminal of the gate-driving transistor and a current-carrying terminal of the gate-driving transistor,
   a first transistor of the first pair of transistors having a current-carrying terminal electrically coupled to a first end terminal of the first series combination of one or more voltage clamping transistors, and
   a first transistor of the second pair of transistors having a first current-carrying terminal electrically coupled to a second end terminal of the first series combination of one or more voltage clamping transistors.

2. The circuit of claim 1,
   wherein the circuit further comprises a second series combination of one or more voltage clamping transistors,
   wherein the first current-carrying terminal of the first transistor of the second pair of transistors is connected to a first end terminal of the second series combination of one or more voltage clamping transistors, and wherein a second end terminal of the second series combination of one or more voltage clamping transistors is connected to a second reference voltage.

3. The circuit of claim 2, wherein the second series combination of one or more voltage clamping transistors comprises two voltage clamping transistors.

4. The circuit of claim 3, wherein the circuit further comprises an input amplifier comprising a voltage clamping transistor of the second series combination of one or more voltage clamping transistors.

5. The circuit claim 4, wherein the input amplifier is an inverter.

6. The circuit of claim 3, wherein the control terminal of the gate-driving transistor is connected to a common node between two voltage clamping transistors of the second series combination of one or more voltage clamping transistors.

7. The circuit of claim 1, wherein the capacitor comprises a field effect transistor having two current-carrying terminals connected together.

8. The circuit of claim 1, wherein each transistor of the first pair of transistors and each transistor of the second pair of transistors is a field effect transistor.

9. The circuit of claim 1, wherein the circuit comprises M stress limiter stages including a first stress limiter stage, M being a positive integer, wherein the first stress limiter stage includes the second pair of transistors and a transistor of the first series combination of one or more voltage clamping transistors, and wherein a voltage drop across the circuit is M+2 times a maximum stress voltage of the first transistor of the first pair of transistors.

10. A circuit, comprising:

a first transistor of a first pair of transistors configured as a cross-coupled pair of transistors, the first transistor having a first current-carrying terminal connected to an upper reference voltage;

a first transistor of a second pair of transistors, configured as a cross-coupled pair of transistors;

a second transistor, connected to a lower reference voltage;

a gate-driving transistor having a first current-carrying terminal connected to a first reference voltage and a second current-carrying terminal connected to a control terminal of a second transistor of the second pair of transistors; and a capacitor connected between a control terminal of the gate-driving transistor and a current-carrying terminal of the gate-driving transistor, the circuit having a complementary pair of inputs and a first complementary pair of outputs, the circuit being configured to produce, in a first state, on a second current-carrying terminal of the first transistor, a first voltage, the first voltage being, relative to the lower reference voltage, greater than twice a maximum stress voltage of the first transistor.

11. The circuit of claim 10, further comprising:

a first series combination of one or more voltage clamping transistors, the first transistor of the first pair of transistors having a second current-carrying terminal connected to a first end terminal of the first series combination of one or more voltage clamping transistors, and the first transistor of the second pair of transistors having a first current-carrying terminal connected to a second end terminal of the first series combination of one or more voltage clamping transistors.

12. The circuit of claim 11, further comprising a second series combination of one or more voltage clamping transistors, wherein:

the first current-carrying terminal of the first transistor of the second pair of transistors is connected to a first end terminal of the second series combination of one or more voltage clamping transistors, and a second end terminal of the second series combination of one or more voltage clamping transistors is connected to the lower reference voltage.

13. The circuit of claim 12, wherein the second series combination of one or more voltage clamping transistors comprises two voltage clamping transistors.

14. The circuit of claim 13, further comprising an input amplifier comprising a voltage clamping transistor of the second series combination of one or more voltage clamping transistors.

15. The circuit of claim 14, wherein the input amplifier is an inverter.

16. The circuit of claim 13, wherein a control terminal of the gate-driving transistor is connected to a common node between two voltage clamping transistors of the second series combination of one or more voltage clamping transistors.

17. The circuit of claim 10, wherein the capacitor comprises a field effect transistor having two current-carrying terminals connected together.

18. A method, comprising:

operating, by a level shifter, in a first state; and operating, by the level shifter, in a second state, the operating in the first state comprising translating, by a stress limiter stage, each of two input voltages of the stress limiter stage by a voltage increment to form two respective output voltages of the stress limiter stage each higher than the respective input voltage by the voltage increment, the voltage increment being less than or equal to a maximum stress voltage of a transistor of the level shifter, the stress limiter stage comprising:

a cross-coupled pair of transistors;

a gate-driving transistor having a first current current-carrying terminal connected to a first reference voltage and a second current-carrying terminal connected to a control terminal of a transistor of the cross-coupled pair of transistors; and a capacitor connected between a control terminal of the gate-driving transistor and a current-carrying terminal of the gate-driving transistor, the level shifter having an input and an output, a voltage difference between the input and the output being, in each of the first state and the second state, equal to at least 1.5 times a maximum stress voltage of a transistor of the level shifter.

\* \* \* \* \*